United States Patent [19]

Saxe

[11] 4,271,488

[45] Jun. 2, 1981

[54] HIGH-SPEED ACQUISITION SYSTEM EMPLOYING AN ANALOG MEMORY MATRIX

[75] Inventor: Charles L. Saxe, Beaverton, Oreg.

[73] Assignee: Tektronix, Inc., Beaverton, Oreg.

[21] Appl. No.: 29,807

[22] Filed: Apr. 13, 1979

[51] Int. Cl.³ .............................................. G11C 13/00
[52] U.S. Cl. ........................................ 365/230; 320/1; 365/45
[58] Field of Search ................. 320/1; 365/45, 46, 48, 365/230

[56] References Cited

U.S. PATENT DOCUMENTS

| | | | |
|---|---|---|---|
| 3,701,120 | 10/1972 | Charters et al. | 365/45 |
| 3,701,978 | 10/1972 | Miller | 365/45 |
| 3,763,480 | 10/1973 | Weimer | 365/183 |
| 4,084,257 | 4/1978 | Burke et al. | 365/45 |

*Primary Examiner*—Terrell W. Fears
*Attorney, Agent, or Firm*—George T. Noe

[57] ABSTRACT

A high-speed acquisition system employing an analog memory matrix is provided in which sample-hold elements connected to an analog bus are arranged in rows and columns to form an M×N matrix. The system is operable in a fast in-slow out mode, and the analog memory matrix may be implemented on a single integrated-circuit semiconductor chip.

8 Claims, 7 Drawing Figures

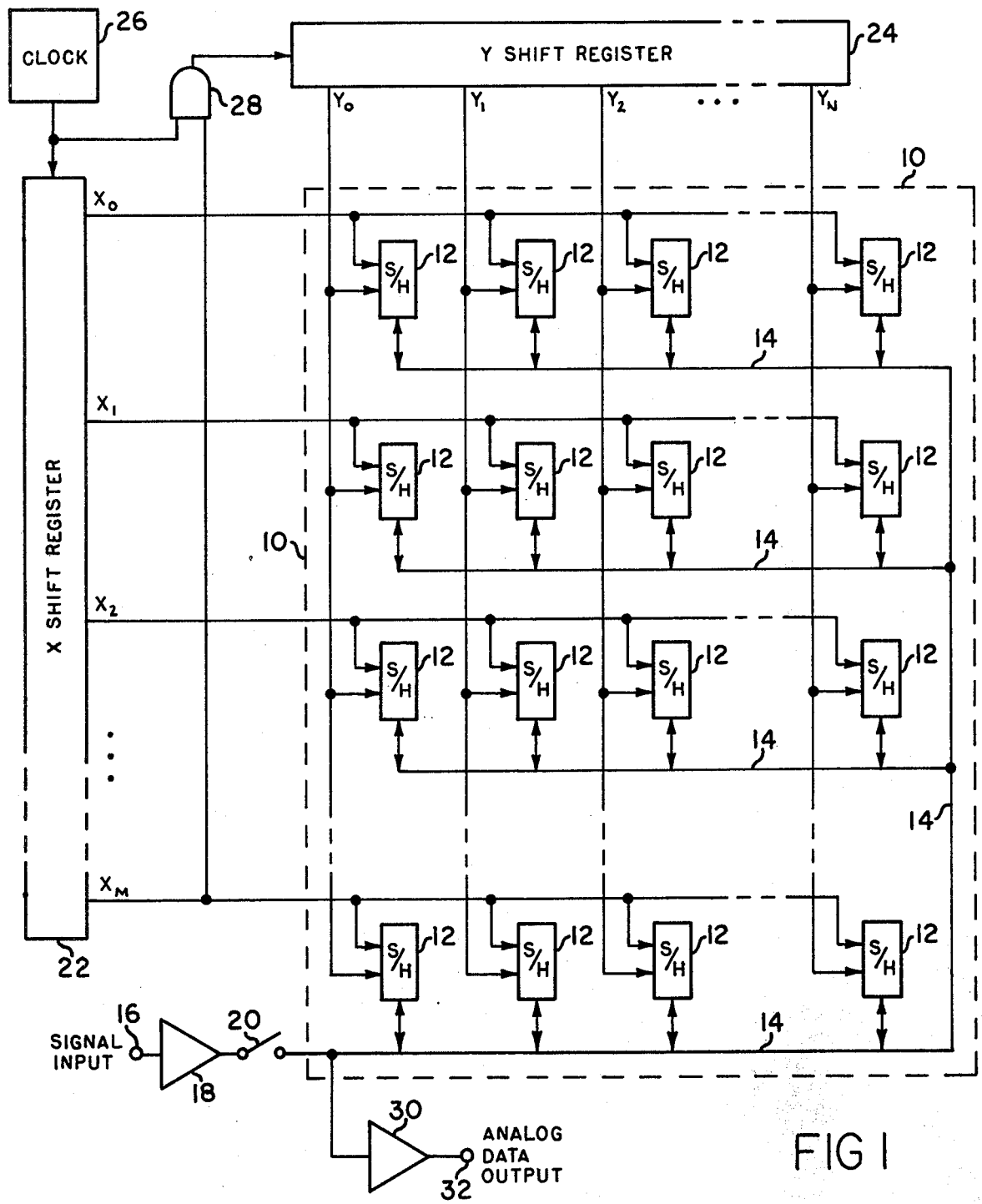
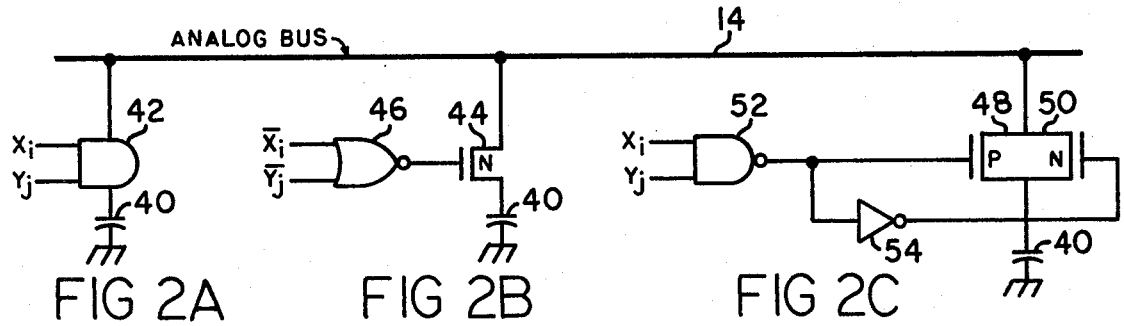
FIG 1
FIG 2A  FIG 2B  FIG 2C

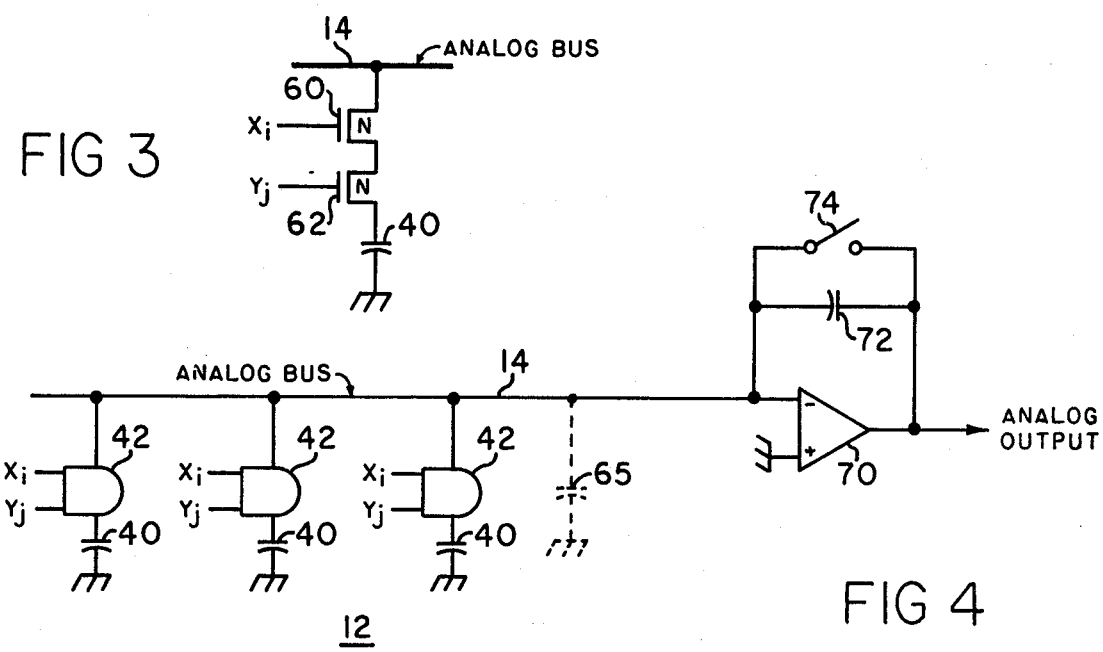
FIG 3
FIG 4
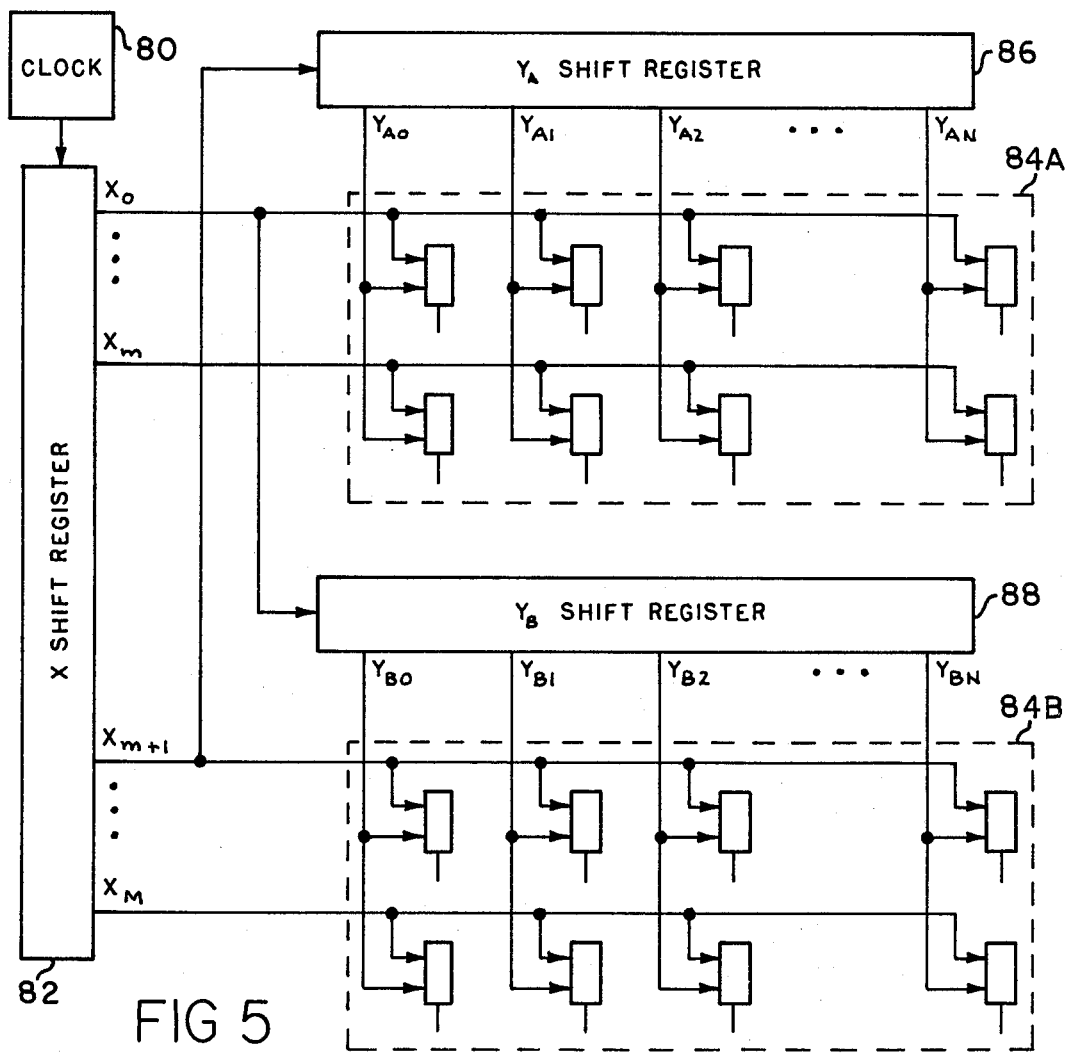
FIG 5

4,271,488

HIGH-SPEED ACQUISITION SYSTEM EMPLOYING AN ANALOG MEMORY MATRIX

BACKGROUND OF THE INVENTION

The present invention relates to acquisition of high-frequency analog signals.

Analog memories have been employed in the acquisition of high-frequency analog signals, particularly to facilitate reading the analog signals out of memory at a slower rate than they were stored so that the acquired analog signals may be processed by circuits having relaxed bandwidth requirements. Serial analog memories in the form of sample-hold elements disposed along and activated by the outputs of a high-speed shift register have been effective in the acquisition of high-frequency analog signals. However, to adequately store a complete waveform, such a serial analog memory requires a shift register which is fairly long, for example, 100 elements or more in length.

Prior serial analog memories have been implemented using large-scale integration (LSI) technology to produce metal-oxide-semiconductor (MOS) chips with the entire memory, including the shift register, sample-hold elements, and analog bus, on the chip. Operation of a shift register on a complementary-metal-oxide-semiconductor (CMOS) chip is limited to about 25 megahertz, which limits the sampling rate. Further, for a 100-element shift register, an external clock must drive 100 shift register flip-flops at several times the frequency of the analog signal. A further problem is that in the readout mode of operation, the MOS capacitors associated with the sample-hold elements must drive a relatively large capacitance associated with the analog bus, resulting in a substantial attenuation of the analog signal voltage.

SUMMARY OF THE INVENTION

In accordance with the present invention, a high-speed acquisition system employing an analog memory matrix is provided in which sample-hold elements connected to an analog bus are arranged in rows and columns to form an $M \times N$ matrix. An X shift register drives the M row control lines, and a Y shift register drives the N column control lines. The sample-hold elements are activated in a sequence determined by the shift registers, each sample-hold element requiring both a column and a row activating signal. The system is arranged so that the X shift register operates at a rate determined by a high-speed clock, and the Y shift register operates at a rate $1/M$, where M is the number of rows in the matrix. The circuit is particularly useful in a fast in-slow out mode of operation; that is, an input analog signal may be stored in the analog memory matrix at a high rate of speed, for example, up to 100 megasamples per second, and read out of memory at a lower frequency for processing by circuits having relaxed bandwidth characteristics. A charge amplifier may be utilized in the readout mode to effect nearly a 100 percent transfer of charge from the capacitors of the sample-hold elements. To prevent clock skew, which is caused by a slow-switching Y register, the analog memory may be split into an upper portion and a lower portion, each of which is driven by a separate Y shift register, and both of which share a common X shift register. This arrangement permits the appropriate Y shift register to be clocked in advance of when it is needed in the matrix-scanning sequence.

The high-speed acquisition system may be implemented as an integrated circuit on a metal-oxide-semiconductor chip. For implementation in bulk silicon, the high speed synchronous logic, including the clock and the X register, may be located off the chip. Thus, using 16 × 16 analog memory matrix and a clock frequency of 100 megahertz as an example, the highest on-chip frequency would be 6.25 megahertz, which is well within the operating parameters of MOS bulk silicon integrated circuits. If silicon-on-sapphire (SOS) technology is used, the entire circuit may be implemented without danger of exceeding operating limits for sample rates of approximately 50 megahertz.

It is therefore one object of the present invention to provide a high-speed acquisition system employing an analog memory matrix.

It is another object to provide a high-speed acquisition system in which a matrix of sample-hold elements are integrated onto a single LSI chip.

It is a further object to provide a high-speed acquisition system having an analog memory matrix operable in a fast in-slow out mode of operation.

It is an additional object to provide a high-speed acquisition system having a store and a readout mode wherein the readout mode a substantially 100% charge transfer is effected.

Other objects and advantages will become apparent to those having ordinary skill in the art upon a reading of the following description when taken in conjunction with the accompanying drawings.

BRIEF DESCRIPTION OF THE DRAWINGS

FIG. 1 is a functional block diagram of a high-speed acquisition system employing an analog memory in accordance with the present invention;

FIGS. 2A–2C show alternative sample-hold element embodiments for use in the matrix of FIG. 1;

FIG. 3 shows the details of the sample-hold element of FIG. 2A;

FIG. 4 is a circuit diagram of a charge amplifier suitable for use in a read-out mode of operation; and FIG. 5 is a functional block diagram of a split analog memory.

DETAILED DESCRIPTION OF THE INVENTION

A functional block diagram of a high-speed acquisition system employing an analog memory in accordance with the present invention is shown in FIG. 1. A matrix 10 comprising electrical intersections arranged in M rows and N columns is shown generally enclosed by a dashed line. The row lines of the matrix are designated $X_0, X_1, X_2, \ldots, X_M$, and the column lines are designated $Y_0, Y_1, Y_2, \ldots, Y_N$. The matrix 10 includes an M × N array of sample-hold (S/H) elements 12, each S/H element 12 being associated with an electrical intersection and having two control inputs connected respectively to the row (X) and the column (Y) line at that intersection. The S/H elements 12 are connected to an analog bus 14, which bus is utilized for both store and readout operations.

An input analog signal is applied to the matrix 10 via an input terminal 16, a buffer amplifier 18, the closed contacts of a switch 20 which may be an electromechanical switch or an electronic switch such as a transistor, and the aforementioned analog bus 14. When both control inputs of any S/H element 12 are activated, a sample of the analog signal is taken and stored by the S/H element. The S/H elements are activated sequentially in the following manner.

An X shift register 22 is provided to drive the X lines of the matrix, and a Y shift register 24 is provided to drive the Y lines. Before the start of the store, or write, operation, both the X and Y shift registers are reset and initialized so that the respective outputs thereof are $(X_0, X_1, X_2, \ldots, X_M) = (1, 0, 0, \ldots, 0)$ and $(Y_0, Y_1, Y_2, \ldots, Y_N) = (1, 0, 0, \ldots, 0)$. In the initialized condition, the S/H element 12 at $(X_0, Y_0)$ is activated. A clock 26 is connected directly to the clock input of X shift register 22 to cause the logical one placed in the first stage to be shifted along the shift register under clock control. The clock 26 is also coupled to the clock input of Y shift register 24 through one input of an AND gate 28, the other input of which is connected to the $X_M$ output of X shift register 22. Assuming that both the X and Y shift registers are toggled on a trailing negative clock edge, the Y shift register 24 will not receive a clock edge until the logical one has shifted all the way through the X shift register 22 to the $X_M$ output, activating the AND gate 28 output in conjunction with a clock signal from clock 26. Thus, it can be discerned that in operation, the $Y_0$ column line is held activated while all of the $X_0$ to $X_M$ row lines are sequentially activated in turn. Then the $Y_1$ column line is held activated while again the $X_0$ to $X_M$ row lines are activated in turn. Finally, the $Y_N$ column line is held activated while all of the $X_0$ to $X_M$ row lines are sequentially activated in turn to complete one full scanning cycle of the matrix 10. Mathematically stated, the scanning sequence of the matrix is:

| | |
|---|---|
| $X_0$ | $Y_0$ |
| . | . |
| . | . |
| . | . |
| $X_M$ | $Y_0$ |
| $X_0$ | $Y_1$ |
| . | . |
| . | . |
| $X_M$ | $Y_1$ |
| . | . |
| . | . |
| $X_0$ | $Y_N$ |
| . | . |
| . | . |
| $X_M$ | $Y_N$ |

In addition to sampling and storing analog values of an input analog signal as just described, the stored information may be read out by opening switch 20 to disconnect the signal input and clocking the stored information out using the clocking sequence described hereinabove. As each S/H element 12 is activated in turn, the stored analog sample is placed on the analog bus 14 and made available via output buffer amplifier 30 at an output terminal 32.

Of course, it should be mentioned that due to the minimal loading by amplifier 30 on the bus 14, the input signal may be monitored during the store cycle by circuits or equipment connected to terminal 32. Additionally, with switch 20 connected and the clock 26 inhibited, amplifiers 18 and 30 could be part of an analog processing channel in which signal or waveform storage is a selectable option.

The foregoing circuit may be implemented to provide a fast in-slow out storage matrix wherein the clock 26 is operated at a high clock rate, for example, 50 to 100 megahertz, to store a signal or a waveform, and then operated at a lower clock rate, for example, about one megahertz to clock the stored analog information out in the same order in which it was stored. Thus high-speed signals may be captured and subsequently processed by circuits that are less sophisticated and less expensive than would otherwise be required. Implementation may be realized on an integrated circuit chip to take advantage of metal-oxide-semiconductor (MOS) technology. For bulk silicon devices, the circuit may be optimized for high speed operation by removing from the chip all fast synchronous logic, such as the X shift register 22 and clock 26. The Y shift register 24, the operating speed of which need by only 1/M that of the X shift register 22, may be located on the chip. As an example, in a case in which a 100-megahertz clock is driving a $16 \times 16$ matrix, the operating speed on the chip is only 6.25 megahertz, which is well within satisfactory operating parameters of bulk silicon metal-oxide-semiconductor devices. For silicon-on-sapphire semiconductor devices, higher frequencies may be capably handled, and thus the entire system for the $16 \times 16$ matrix example discussed may be implemented on a single chip.

The sample-hold elements themselves may be implemented in several ways, as shown in FIGS. 2A to 2C. In FIG. 2A, an MOS capacitor 40 is connected between ground and the analog bus 14 when both inputs of an AND gate 42 are activated. The inputs to the AND gate 42 are the $X_i$ and $Y_j$ signals, where $i = (0, 1, 2, \ldots, M)$ and $j = (0, 1, 2, \ldots, N)$. In FIG. 2B, the MOS capacitor 42 is connected between ground and the analog bus 14 through an N-channel field-effect transistor (FET) 44 which is turned on by a positive-going signal from NOR gate 46 when both inputs thereof are a logical zero. The use of this particular embodiment would require shifting a logical zero rather than a logical one through the X and Y shift registers 22 and 24 of FIG. 1. In FIG. 2C, the MOS capacitor 40 is connected between ground and the analog bus 14 through a parallel arrangement of P-channel FET 48 and N-channel FET 50 which are both turned when both inputs of a NAND gate 52 are activated. An inverter 54 is interposed between the output of NAND gate 52 and the gate of FET 50 to perform the necessary polarity inversion. In operation, this particular embodiment is subject to clock skews. Of these alternatives, the sample-hold element of FIG. 2A is the preferred embodiment because of its simplicity and operational superiority.

The details of the sample-hold element of FIG. 2A are shown in FIG. 3 the AND gate 42 is replaced by a pair of N-channel FET's 60 and 62 disposed in series with the MOS capacitor 40. For this configuration, the time required to acquire, a sample of the input signal is dependent upon the on-resistance of the two FET's and the capacitance of the MOS sampling capacitor. In order to reduce the time constant to a minimum, it is necessary to maximize the FET channel width and minimize the channel length subject to the constraints of chip areas and stray capacitance effects. As the channel width is increased, the on-resistance is decreased; however, the overlap capacitance from gate to drain and source is increased, causing a greater amount of clock signal feedthrough. For a sample-hold element optimized for a 50 megasample per second matrix system, the desired write period is 20 nanoseconds. If an aperture time of 10 nanoseconds is selected, then the RC time constant should be about 3.3 nanoseconds to allow three times constants for charging the sampling capacitor. For an MOS capacitor of 1.5 picofarads, a total of about 2.2 kilohms of on-resistance in the two FET's is allowable, or about 1.1 kilohm for each FET. A typical N-channel FET with dimensions 0.23 mil by 1.25 mil satisfies this on-resistance requirement while still being small enough to have stray capacitance values of about 0.1 picofarad.

In the read-out mode of operation, the lumped stray capacitance to ground of the analog bus 14 forms a capacitance divider with the various MOS capacitors being connected sequentially to the bus, resulting in a substantial attenuation of the analog output signal. For example, for a bus capacitance which is 10 times the sample capacitance, the voltage attenuation is about 90.9%. However, this situation is ameliorated somewhat if the amount of charge on the sampling capacitors is read out rather than the actual voltage. Here the situation is the reverse in that only about 9.1% of the sampling capacitor charge will be transferred to the bus capacitance due to the effects of charge sharing.

FIG. 4 shows a charge amplifier which is capable of a nearly 100% transfer of samping capacitor charge during the read-out process. Here, the analog bus 14 and a plurality of sample-hold elements 12 comprising AND gates 42 and MOS capacitors 40 are as have been described hereinabove. The lumped analog-bus stray capacitance 65 is shown as a phantom capacitor since it is not actually a physical capacitor. The analog bus 14 is connected to the inverting (−) input of an operational amplifier 70, the non-inverting (+) input of which is connected to ground. A feedback capacitor 72 is connected from the output of operational amplifier 70 to the −input thereof. A shorting switch 74 is connected across the feedback capacitor 72 to reset its charge to zero prior to reading out charge of a given sampling capacitor 40. The value of the feedback capacitor is chosen to be substantially equal to the value of a sampling capacitor 40. Since the −input of the operational amplifier is a virtual ground, the charge on a capacitor 40 is transferred substantially completely to the feedback capacitor 72, effectively eliminating the stray capacitance 65.

For the analog memory of FIG. 1, the slower Y shift register 24 may not switch fast enough as the X shift register 22 output shifts from $X_M$ to $X_0$ resulting in a phenomenon known as clock skew. This problem is overcome by the split analog memory of FIG. 5. In FIG. 5, a clock 80 drives an X shift register 82 in the manner described earlier. The matrix is split into an upper portion 84A and a lower portion 84B, the upper portion being driven by a $Y_A$ shift register 86 and the lower portion being driven by a $Y_B$ shift register 88. The upper matrix portion 84A includes rows designated $X_0$ to $X_m$ consecutively, while the lower matrix portion 84B includes rows designated $X_{m+1}$ to $X_M$ consecutively. Thus, the upper portion may be defined as m X N, while the lower portion is defined as (M−m) X N. The $X_{m+1}$ output line of X shift register 82 is connected to the clock input of $Y_A$ shift register 86. Similarly, the $X_0$ output line of X shift register 82 is connected to the clock input of $Y_B$ shift register 88.

In operation, the X shift register 82 is initialized $(X_0, \ldots, X_m, X_{m+1}, \ldots X_M) = (1, \ldots, 0, 0, \ldots, 0)$, and both the $Y_A$ and $Y_B$ shift registers 86 and 88 respectively are initialized $(Y_{A0}, Y_{A1}, \ldots, Y_{AN}) = (1, 0, \ldots, 0)$ and $(Y_{B0}, Y_{B1}, \ldots, Y_{BN}) = (0, 0, \ldots, 1)$. When the $X_o$ line of shift register 82 is clocked, the $Y_B$ shift register 88 wraps around, placing a logical 1 on the $Y_{B0}$ line. As the logical 1 in the X sample-hold elements in the $Y_0$ column are consecutively energized. When the logical 1 in the X shift register 82 activates the $X_{m+1}$ row line, it also clocks the $Y_A$ shift register 86 and the logical 1 in the $Y_A$ shift register 86 is shifted from the $Y_{A0}$ column to the $Y_{A1}$ column. Thus, at the start of the next scan of the X shift register 82, the $Y_{A1}$ column is already activated. Further, when the $X_0$ row line is activated, the logical 1 clocks the $Y_B$ shift register, causing the logical 1 stored therein to shift from the $Y_{B0}$ column to the $Y_{B1}$ column. The process herein described repeats as the entire matrix is scanned. The split analog memory may be used in a fast in-slow out mode of operation as described previously.

It will, therefore, be appreciated that the aforementioned and other desirable objects have been achieved; however, it should be noted that the particular embodiments of the invention which are shown and described herein are intended as merely illustrative and not restrictive of the invention.

What I claim as being novel is:

1. A high-speed acquisition system, comprising:
   analog signal input means and analog output means;
   an analog bus coupled to said input means and said ouptput means;
   a plurality of analog memory means disposed in M rows and N columns, said analog memory means being coupled to said analog bus; and
   means for activating said analog memory means in a predetermined manner to provide store and readout operations, said means for activating said analog memory means comprising an X shift register having M outputs and a Y shift register having N outputs, M row control lines connected to the outputs of said X register, N column control lines connected to the outputs of said Y register, and means for operating said X shift register at at least one predetermined rate and for operating said Y shift register at a rate 1/M times the rate at which said X register is operated, wherein said row and column control lines form an M×N matrix of electrical intersections each of which corresponds to an analog memory means, each of said analog memory means being connected to both a predetermined row control line and a predetermined column control line for activation thereby.

2. A high-speed acquisition system in accordance with claim 1 wherein said analog signal input means includes a first buffer amplifier and said output means includes a second buffer amplifier, wherein said input means further includes switch means interposed between the output of said first buffer amplifier and said analog bus for disconnecting said first buffer amplifier from said analog bus during said readout operation.

3. A high-speed acquisition system in accordance with claim 1 wherein said output means comprises a charge amplifier, said charge amplifier comprising an operational amplifier having an inverting input, a non-inverting input, and an output, capacitor connected between said output and said inverting input, and wherein the non-inverting input is grounded to provide a virtual ground at said inverting input to effectively eliminate stray capacitance of said analog bus.

4. A high-speed acquisition system in accordance with claim 3 wherein said capacitor has a switch connected thereacross to resist said capacitor by removing any charge stored therein.

5. A high-speed acquisition system in accordance with claim 1 wherein each of said analog memory means comprises a sample-hold element including a capacitive storage device connectable between ground and said analog bus through a dual-input switch means, said dual inputs corresponding respectively to a predetermined row and a predetermined column.

6. A high-speed acquisition system in accordance with claim 5 wherein said dual-input switch means comprises a pair of field-effect transistors serially disposed between said analog bus and said capacitive storage element, the gate of one of said field-effect transistors connected to a row control line and the gate of the other of said field-effect transistors connected to a column control line.

7. A high speed acquisition system in accordance with claim 1 wherein said operating means includes a clock circuit connected to the clock input of said X shift register.

8. A high-speed acquisition system in accordance with claim 1 wherein said $M \times N$ matrix is split into an upper portion defined as $m \times N$ and a lower portion defined as $(M-m) \times N$, and wherein said Y shift register includes an upper shift register for driving the column control lines of said upper portion and a lower shift register for driving the column control lines of said lower portion.

* * * * *